United States Patent
Lim et al.

(10) Patent No.: US 11,765,936 B2
(45) Date of Patent: Sep. 19, 2023

(54) DISPLAY DEVICE INCLUDING A SEMICONDUCTOR LAYER HAVING A REGION WITH A WIDENED WIDTH

(71) Applicant: Samsung Display Co., Ltd., Yongin-si (KR)

(72) Inventors: Sang Hyung Lim, Cheonan-si (KR); Kyu Min Kim, Suwon-si (KR); Hui-Won Yang, Seoul (KR); Dong Ha Lee, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 130 days.

(21) Appl. No.: 17/334,980

(22) Filed: May 31, 2021

(65) Prior Publication Data

US 2022/0130931 A1  Apr. 28, 2022

(30) Foreign Application Priority Data

Oct. 22, 2020 (KR) ........................ 10-2020-0137709

(51) Int. Cl.
| | |
|---|---|
| *H01L 29/08* | (2006.01) |
| *H10K 59/121* | (2023.01) |
| *H01L 29/786* | (2006.01) |
| *H01L 27/12* | (2006.01) |

(52) U.S. Cl.
CPC ...... *H10K 59/1213* (2023.02); *H01L 27/1222* (2013.01); *H01L 29/78696* (2013.01)

(58) Field of Classification Search
CPC ............. H01L 27/3262; H01L 27/1222; H01L 29/78696
USPC ........................................................ 257/40
See application file for complete search history.

(56) References Cited

U.S. PATENT DOCUMENTS

2004/0080012 A1*  4/2004  Kim ................. H01L 29/66833
                                                           257/E21.21
2008/0308850 A1*  12/2008  Berthold ............... G11C 11/412
                                                           365/182

FOREIGN PATENT DOCUMENTS

| JP | 2020137670 | * | 7/2020 | ......... H01L 27/3262 |
| KR | 10-1997-0053546 A | | 7/1997 | |
| KR | 10-0325498 B1 | | 8/2002 | |
| KR | 10-1044542 B1 | | 6/2011 | |
| KR | 10-1190071 B1 | | 10/2012 | |
| KR | 20180050478 | * | 5/2018 | ......... H01L 27/3272 |
| KR | 10-2019-0069058 A | | 6/2019 | |

* cited by examiner

*Primary Examiner* — Phuc T Dang
(74) *Attorney, Agent, or Firm* — Innovation Counsel LLP

(57) ABSTRACT

A display device according to an embodiment includes: a first conductive layer that is disposed on a substrate; a transistor that is disposed on the substrate; and a light emitting element that is electrically connected to the transistor, wherein the transistor includes a semiconductor layer that at least partially overlaps the first conductive layer and is disposed on the first conductive layer, and a gate electrode that is disposed on the semiconductor layer. The semiconductor layer includes a first region that does not overlap the first conductive layer, a third region that overlaps the first conductive layer, and a second region that is disposed between the first region and the third region and traverses an edge of the first conductive layer. The first width of the semiconductor layer in the first region is smaller than a second width of the semiconductor layer in the second region.

20 Claims, 14 Drawing Sheets

DISPLAY DEVICE INCLUDING A SEMICONDUCTOR LAYER HAVING A REGION WITH A WIDENED WIDTH

CROSS-REFERENCE TO RELATED APPLICATION

This application claims priority to and the benefit of Korean Patent Application No. 10-2020-0137709 filed in the Korean Intellectual Property Office on Oct. 22, 2020, the entire contents of which are incorporated herein by reference.

BACKGROUND

(a) Field

The present disclosure relates to a display device.

(b) Description of the Related Art

Recently, as a self-emissive display device, a light emitting diode display has been attracting attention. The light emitting diode display has its own light emitting characteristic, and unlike a liquid crystal display (LCD), it does not require a separate light source, and thus thickness and weight thereof can be reduced. In addition, the light emitting diode display exhibits high quality characteristics such as low power consumption, high luminance, and high reaction speed.

In general, the light emitting diode display includes a plurality of pixels and each pixel includes a plurality of transistors and a light emitting element. The plurality of transistors are connected to a scan line, a data line, and the like, and may transmit a driving current to the light emitting element.

The above information disclosed in this Background section is only for enhancement of understanding of the background of the inventive concept, and therefore it may contain information that does not form the prior art that is already known in this country to a person of ordinary skill in the art.

SUMMARY

Embodiments have made efforts to provide a transistor that is formed in a stably form, and a display device including the same.

A display device according to an embodiment includes: a first conductive layer that is disposed on a substrate; a transistor that is disposed on the substrate; and a light emitting element that is electrically connected to the transistor, wherein the transistor includes a semiconductor layer that at least partially overlaps the first conductive layer and is disposed on the first conductive layer, and a gate electrode that is disposed on the semiconductor layer, the semiconductor layer includes a first region that does not overlap the first conductive layer, a third region that overlaps the first conductive layer, and an second region that is disposed between the first region and the third region, and traverses an edge of the first conductive layer, and a first width of the semiconductor layer in the first region is smaller than a second width of the semiconductor layer in the second region.

The second region may have a protrusion protruding from edges of the first region.

The protrusion may have a shape of an isosceles triangle, a semi-circle, or a right-angled triangle.

The second region may include a vertex having a broadest width and the vertex overlaps the first conductive layer.

The third region of the semiconductor layer may have a third width and each of the first width and the third width may be uniform.

The first width and the third width may be substantially equivalent to each other.

The first width may be smaller than the third width.

An edge of the second region may traverse the edge of the first conductive layer obliquely The edge of the second region which traverses the edge of the first conductive layer obliquely may be formed in the shape of a straight line.

An edge of the second region may traverse the edge of the first conductive layer obliquely. The edge of the second region which traverses the edge of the first conductive layer obliquely may be formed in the shape of a curved line.

A display device according to an embodiment includes: a first conductive layer that is disposed on a substrate; a transistor that is disposed on the substrate; and a light emitting element that is electrically connected to the transistor, wherein the transistor includes a semiconductor layer that is partially overlapped with the first conductive layer and is disposed on the first conductive layer, and a gate electrode that overlaps a channel of the semiconductor layer and is disposed on the semiconductor layer, the semiconductor layer includes: a first region that does not overlap is separated from the first conductive layer, a third region that includes an edge crossing the first conductive layer, and a second third region that overlaps the first conductive layer, and an second region that is disposed between the first region and the third region and includes an edge traversing an edge of the first conductive layer, wherein the intermediate third region has a protrusion protruding protrudes from an edge of the first region and the third region.

A first width of the semiconductive layer in the first region may be smaller than a second width of the semiconductor layer in the second region.

The edge of the second region may traverse the edge of the first conductive layer obliquely. The second region may include a vertex which has a broadest width and overlaps the first conductive layer.

A width of the second region may be gradually widened toward the vertex.

The second region may be gradually narrowed toward the third region from the vertex.

The third region may include a polygonal shape or a semi-circular shape.

The second region may have a polygonal shape or a semi-circular shape.

A display device according to an embodiment includes: a first conductive layer that is disposed on a substrate; a transistor that is disposed on the substrate; and a light emitting element that is electrically connected to the transistor, wherein the transistor includes a semiconductor layer that at least partially overlaps the first conductive layer and is disposed on the first conductive layer, a gate electrode that is disposed on the semiconductor layer while overlapping a channel of the semiconductor layer, the semiconductor layer includes a first region that does not overlap the first conductive layer, a third region that overlaps the first conductive layer, and an second region that that is disposed between the first region and the third region and overlaps an edge of the first conductive layer. A width of the first region may be smaller than a width of the third region.

The second region may include an edge that connects a first edge of the first region and a second edge of the third region.

The edge that connects the first edge of the first region and the second edge of the third region may have a shape of a curved line or a straight line.

A width of the second region may be gradually widened toward the third region.

A width of the second region may be larger than a width of the first region.

According to the embodiments, a semiconductor layer that is disposed on a conductive layer is stably formed, and thus a transistor having a constant characteristic, and a display device including the transistor can be provided.

DETAILED DESCRIPTION OF THE EMBODIMENTS

Figure 1:
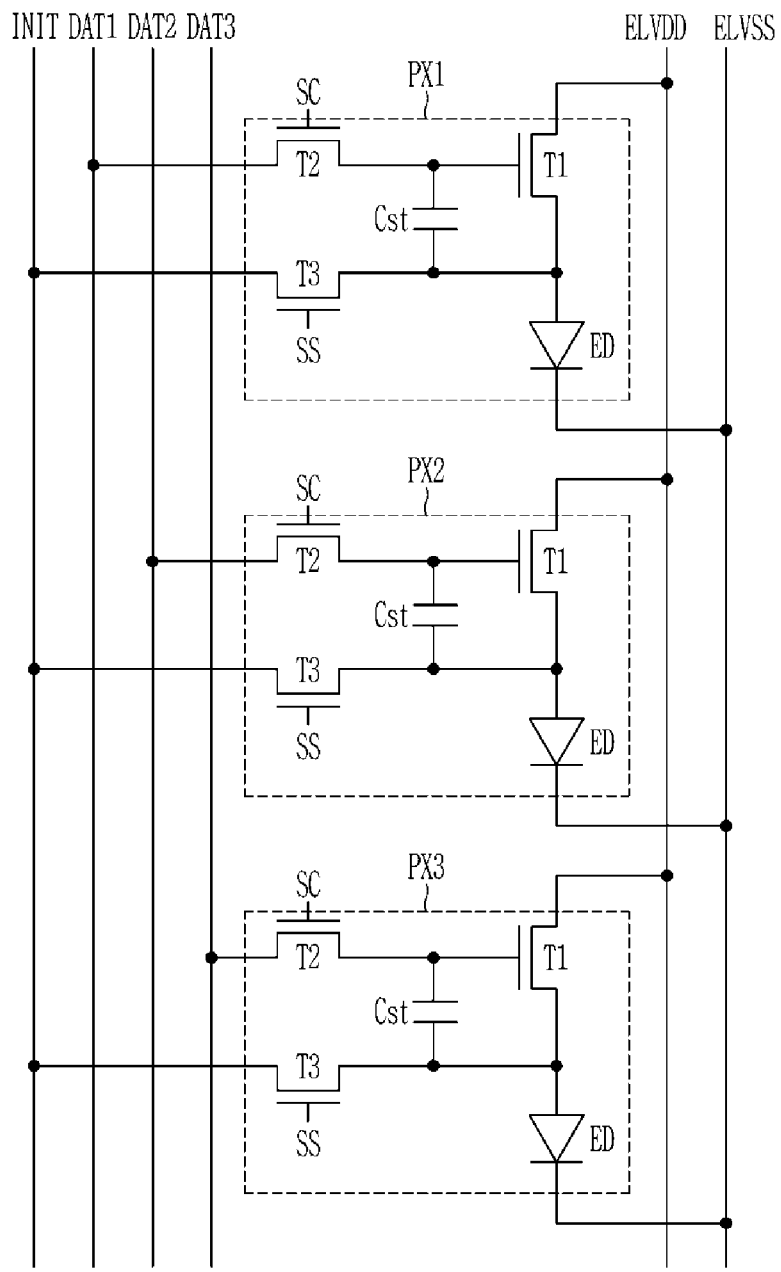
FIG. 1 is a circuit diagram of a pixel of a display device according to an embodiment.

The present inventive concept will be described more fully hereinafter with reference to the accompanying drawings, in which embodiments of the inventive concept are shown. As those skilled in the art would realize, the described embodiments may be modified in various different ways, all without departing from the spirit or scope of the present inventive concept.

The drawings and description are to be regarded as illustrative in nature and not restrictive. Like reference numerals designate like elements throughout the specification.

In the drawings, size and thickness of each element are arbitrarily illustrated for convenience of description, and the present inventive concept is not necessarily limited to as illustrated in the drawings. In the drawings, the thickness of layers, films, panels, regions, etc., are exaggerated for clarity. In addition, in the drawings, for better understanding and ease of description, the thicknesses of some layers and regions are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to be positioned above or below the target element and will not necessarily be understood to be positioned "at an upper side" based on an opposite to gravity direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "in a plan view" means viewing a target portion from the top, and the phrase "on a cross-section" means viewing a cross-section formed by vertically cutting a target portion from the side.

FIG. 1 is a circuit diagram of a pixel of a display device according to an embodiment.

A display device according to an embodiment includes a plurality of pixels PX1, PX2, and PX3. As shown in FIG. 1, each of the plurality of pixels PX1, PX2, and PX3 includes a plurality of transistors T1, T2, and T3, a capacitor Cst, and at least one light emitting diode ED which is a light emitting element. In the present embodiment, each of the pixels PX1, PX2, and PX3 including a single light emitting diode ED will be described as an example.

The plurality of transistors T1, T2, and T3 include a driving transistor T1, a switching transistor T2, and an initialization transistor T3. A first electrode and a second electrode, which will be described below, may be provided to distinguish two electrodes that are disposed at opposite sides of a channel of each of the transistors T1, T2, and T3, and may be a source electrode and a drain electrode.

A gate electrode of the driving transistor T1 is connected to one end of the capacitor Cst. A first electrode of the first driving transistor T1 is connected to a driving voltage line that transmits a driving voltage ELVDD. A second electrode of the driving transistor T is connected to an anode of the light emitting diode ED and the other end of the capacitor Cst. The driving transistor T1 receives data voltages DAT1, DAT2, and DAT3 from data lines DAT1, DAT2, and DAT3 when the switching transistor T2 is turned-on. the capacitor Cst stores the data voltages DAT1, DAT2, and DAT3, and the driving transistor supplies a driving current to the light emitting diode ED according to a voltage stored in the capacitor Cst.

A gate electrode of the switching transistor T2 is connected to a first scan line that transmits a first scan signal SC. First electrodes of the switching transistors T2 are connected to the data lines that transmit the data voltages DAT1, DAT2, and DAT3 or a reference voltage. A second electrode of the switching transistor T2 is connected with one end of the capacitor Cst and the gate electrode of the driving transistor T1. The switching transistor T2 is turned on according to the first scan signal SC having turn-on level and thus may transmit a reference voltage or one of the data voltages DAT1, DAT2, and DAT3 to the gate electrode of the driving transistor T1 and one end of the capacitor Cst.

A gate electrode of the initialization transistor T3 is connected to a second scan line that transmits a second scan signal SS. A first electrode of the initialization transistor T3 is connected to the other end of the capacitor Cst, the second electrode of the driving transistor T1, and the anode of the light emitting diode ED. A second electrode of the initialization transistor T3 is connected to an initialization voltage line that transmits an initialization voltage INIT. The initialization transistor T3 is turned on according to the second scan signal SS having turn-on level and thus may initialize a voltage of the anode of the light emitting diode ED by transmitting the initialization voltage INIT to the anode of the light emitting diode ED and the other end of the capacitor Cst.

One end of the capacitor Cst is connected to the gate electrode of the driving transistor T1. The other end of the capacitor Cst is connected to a first electrode of the initialization transistor T3 and the anode of the light emitting diode ED. A cathode of the light emitting diode ED is connected to a common voltage line that transmits a common voltage ELVSS.

The light emitting diode ED may emit light with luminance according to a driving current that is generated by the driving transistor T1.

An operation of the each of the pixels PX1, PX2, and PX3 in FIG. 1 during one frame will be described. Here, the transistors T1, T2, and T3 are provided as N-type channel transistors, but this is not restrictive.

When one frame starts, a high-level first scan signal SC and a high-level second scan signal SS are supplied in an initialization period to turn on the switching transistor T2 and the initialization transistor T3. The reference voltage from the data line is supplied to the gate electrode of the driving transistor T1 and one end of the capacitor Cst through the turned-on switching transistor T2, and the initialization voltage INIT is supplied to the second electrode of the driving transistor T1 and the anode of the light emitting diode ED through the turned-on initialization transistor T3. Accordingly, the second electrode of the driving transistor T1 and the anode of the light emitting diode ED are initialized with the initialization voltage INIT during the initialization section. In this case, a difference between the reference voltage and the initialization voltage INIT is stored in the capacitor Cst.

Next, in a sensing period, when the second scan signal SS becomes low while the high-level first scan signal SC is maintained, the switching transistor T2 maintains the turned-on state and the initialization transistor T3 is turned off. The gate electrode of the driving transistor T1 and one end of the gate electrode of the driving transistor T1 are maintained with the reference voltage through the turned-on switching transistor T2, and the second electrode of the driving transistor T1 and the anode of the light emitting diode ED are disconnected from the initialization voltage INIT through the turned-off initialization transistor T3. Accordingly, the driving transistor T1 is turned-on until a voltage difference between the gate electrode and the source electrode of the driving transistor T1 (Vgs) becomes a threshold voltage of the driving transistor and is turned off when the voltage of the second electrode of the driving transistor T1 becomes "reference voltage-Vth". Vth denotes a threshold voltage of the driving transistor T1. In this case, a difference between the gate electrode of the driving transistor T1 and the voltage of the second electrode is stored in the capacitor Cst and sensing of the threshold voltage Vth of the driving transistor T1 is completed. A data signal compensated by reflecting the characteristic information sensed during the sensing period is generated such that the characteristic deviation of the driving transistor T1, which may be different for each pixel, can be externally compensated.

Next, when a high-level first scan signal SC and a low-level second scan signal SS are supplied during a data input section, the switching transistor T2 is turned-on and the initialization transistor T3 is turned-off. Each of the data voltages DAT1, DAT2, and DAT3 from the data lines is supplied to the respective gate electrode of the driving transistor T1 and one end of the capacitor Cst through the turned-on switching transistor T2. In this case, the second electrode of the driving transistor T1 and the anode of the light emitting diode ED can almost maintain the potential in the sensing section by the driving transistor T1, which is in the turned-off state.

Next, the driving transistor T1 in each of the pixels PX1, PX2, and PX3 turned on by a respective data voltage among the data voltages DAT1, DAT2, and DAT3 transmitted to the gate electrode of the driving transistor T1 during a light emitting period generates a driving current according to the respective data voltage among the data voltages DAT1, DAT2, and DAT3, and the light emitting diode ED may emit light by the driving current.

Figure 3A:
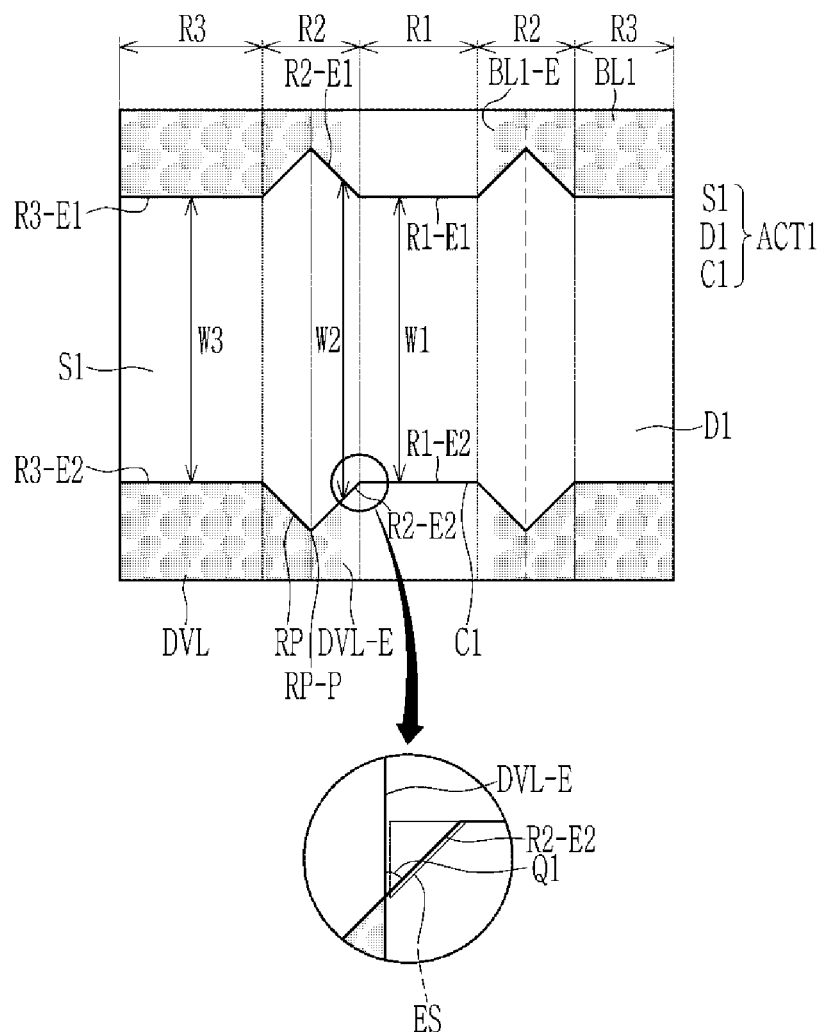
FIG. 3A, FIG. 3B, FIG. 3C are top plan views illustrating some constituent elements of the transistor.
Figure 3B:
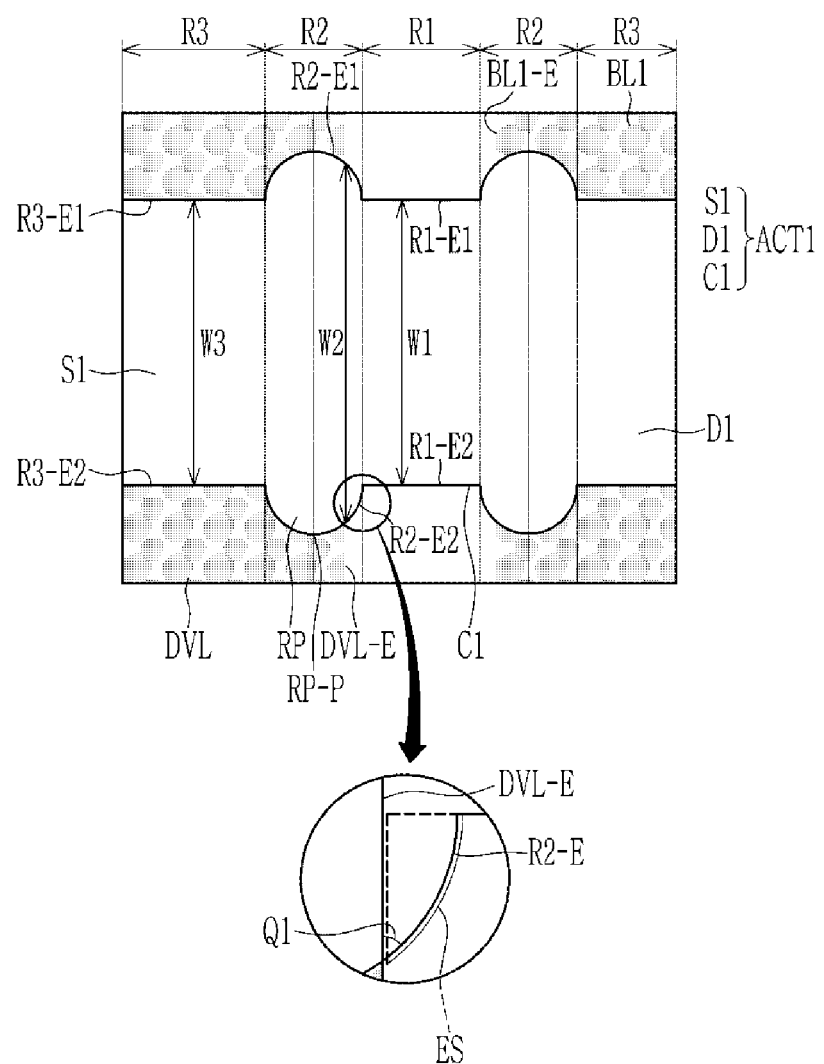
Figure 3C:
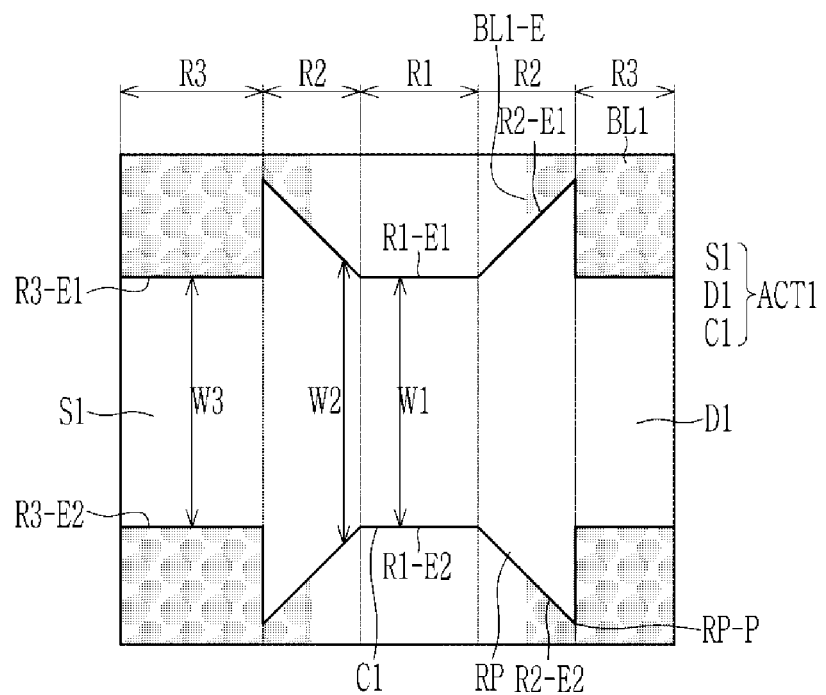
Figure 4A:
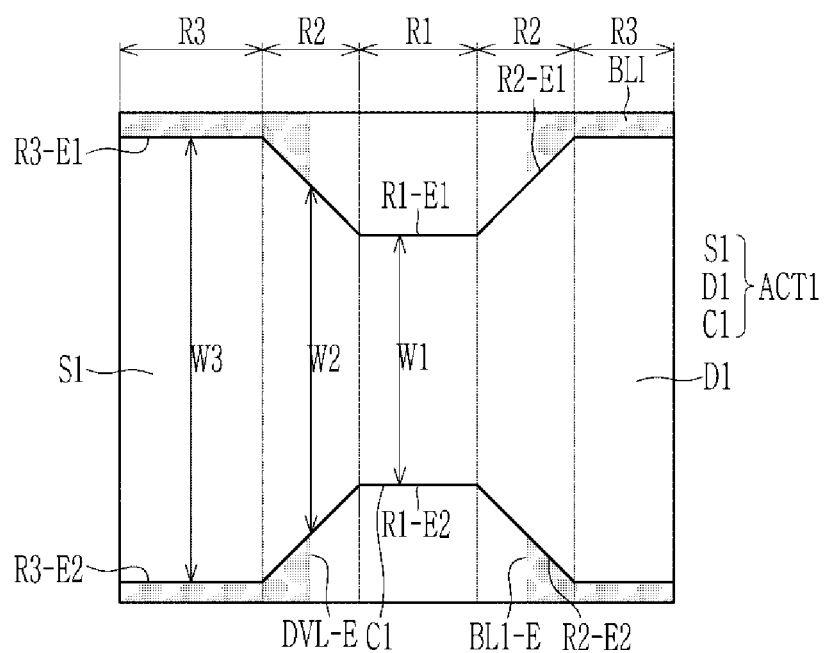
FIG. 4A, and FIG. 4B are top plan views illustrating some constituent elements of the transistor.
Figure 4B:
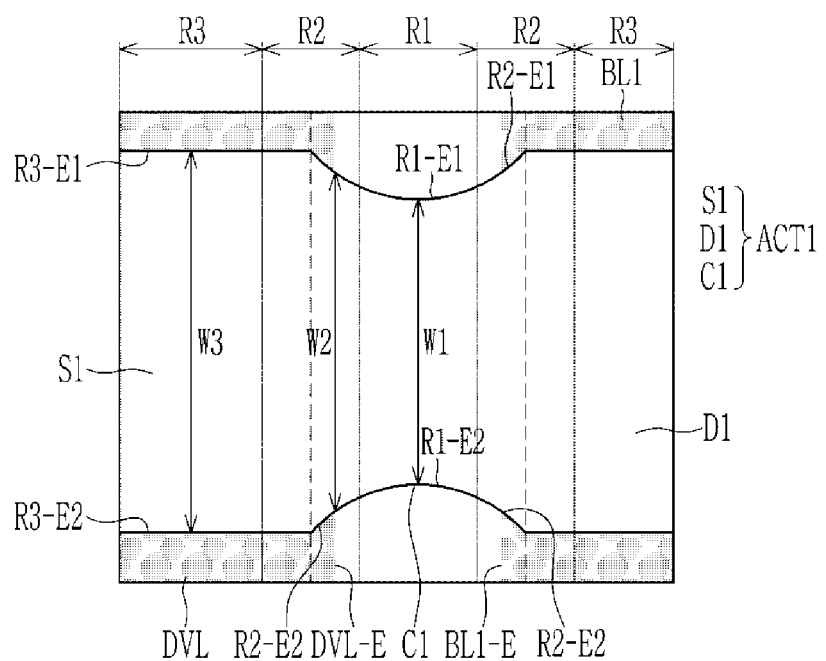

Next, referring to FIG. 2A to FIG. 4B, the shape of the transistor according to the embodiment will be described. A transistor may be applied to any one of the above-described three transistors, the driving transistor T1, the switching transistor T2, and the initialization transistor T3. Hereinafter, a case in which the transistor is a driving transistor T1 will be described FIG. 2A is a schematic top plan view of a transistor, FIG. 2B is a cross-sectional view of FIG. 2A taken along the line A-A', FIG. 3A, FIG. 3B, and FIG. 3C are top plan views illustrating some constituent elements of the transistor, and FIG. 4A and FIG. 4B are top plan views illustrating some constituent elements of the transistor.

Figure 2A:
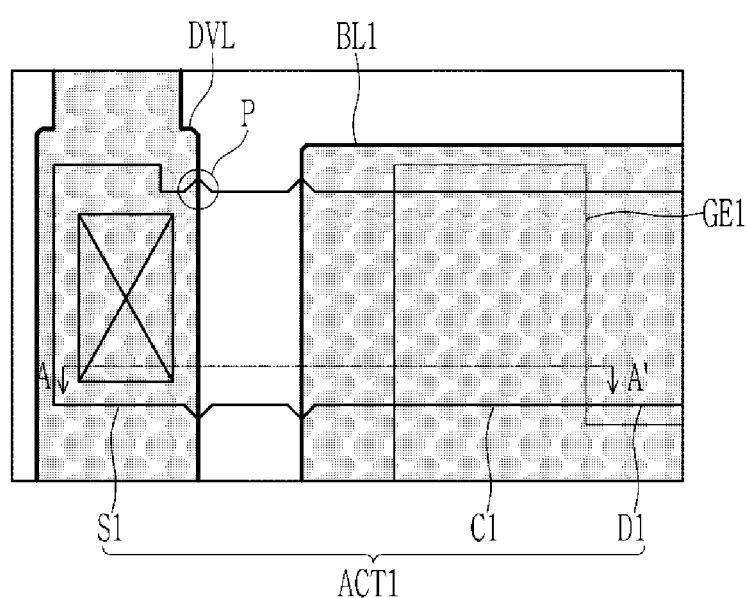
FIG. 2A is a schematic top plan view of a transistor.
Figure 2B:
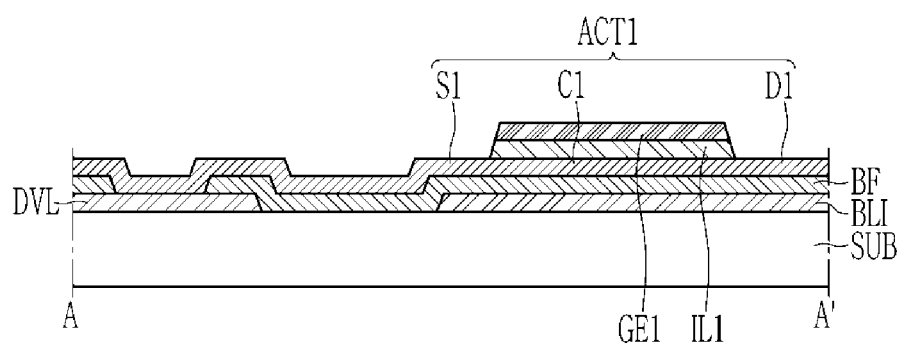
FIG. 2B is a cross-sectional view of FIG. 2A taken along the line A-A'.

First, referring to FIG. 2A and FIG. 2B, a first conductive layer is disposed on a substrate SUB. The first conductive layer may include a first metal layer BL1 and a driving voltage line DVL that transmits a driving voltage ELVDD.

The first conductive layer (BL1 and DVL) may include molybdenum (Mo), aluminum (Al), copper (Cu), silver (Ag), chromium (Cr), tantalum (Ta), titanium (Ti), and the like, and may have a single-layered or multi-layered structure including the same. For example, the first conductive layer (BL1 and DVL) may include a double-layered structure including titanium and copper.

A buffer layer BF may be disposed on the first metal layer BL1 and the driving voltage line DVL. The buffer layer BF may include a silicon oxide (SiOx), a silicon nitride (SiNx), or a silicon oxynitride (SiOxNy). The buffer layer BF may overlap the entire substrate SUB.

A semiconductor layer ACT1 may be disposed on the buffer layer BF. The semiconductor layer ACT1 may include a first electrode region S1 that is electrically connected to the driving voltage line DVL, a second electrode region D1 that is electrically connected to an anode of a light emitting diode which will be described later, and a channel C1 that is disposed between the first electrode region S1 and the second electrode region D1.

A gate electrode GE1 may be disposed on the semiconductor layer ACT1, particularly, on the channel C1. The gate electrode GE1 may include molybdenum Mo), aluminum (Al), copper (Cu), silver (Ag), chromium (Cr), tantalum (Ta), titanium (Ti), and the like, and may have a single-layered or multi-layered structure including the same.

A first insulation layer IL1 may be disposed between the gate electrode GE1 and the channel C1. The first insulation layer IL1 may include a silicon oxide (SiOx), a silicon nitride (SiNx), or a silicon oxynitride (SiOxNy). The first insulation layer IL1 may have a substantially the same planar shape as the gate electrode GE1, or may be formed to overlap the entire substrate SUB.

The semiconductor layer ACT1 according to the embodiment includes an edge that crosses an edge of the first conductive layer (BL1 and DVL). A semiconductor layer ACT1 that crosses the first conductive layer (BL1 and DVL) may include a protruded region P. Hereinafter, a shape of the semiconductor layer and a shape of the first conductive layer will be described in detail with reference to FIG. 3A to FIG. 4B.

First, referring to FIG. 3A, the semiconductor layer ACT1 may include a first region R1 that is disposed between the first metal layer BL1 and the driving voltage line DVL, and does not overlap the first conductive layer (BL1 and DVL), a third region R3 that overlaps the first conductive layer (BL1 and DVL), and a second region R2 that is disposed between the first region R1 and the third region R3. The second region R2 may overlaps edges BL1-E and DVL-E of the first conductive layer (BL1 and DVL).

The first region R1 may include two edges R1-E1 and R1-E2 that face each other. A distance between the edges R1-E1 and R1-E2 may have a uniform value, a first width W1. The first region R1 may have a rectangular shape.

The second region R2 may include edges R2-E1 and R2-E2 that are connected to the edges R1-E1 and R1-E2 of the first region R1. The edges R2-E1 and R2-E2 of the second region R2 may be inclined with respect to edges of the first conductive layer (BL1 and DVL). In particular, the edges R2-E1 and R2-E2 of the second region R2 may be inclined with respect to the edges BL1-E and DVL-E of the first conductive layer (BL1 and DVL).

The second region R2 may overlap the edges BL1-E and DVL-E of the first conductive layer (BL1 and DVL). A width of the second region R2 that overlaps the edges BL1-E and DVL-E of the first conductive layer (BL1 and DVL) may have a second width W2. The second width W2 may be larger than the first width W1. The width of the second region R2 may be gradually widened toward the third region R3 from the first region R1, and/or be gradually narrowed toward the third region R3 from the first region R1.

The second region R2 may include a protruding portion RP that protrudes from a line connecting the edge of the first region R1 and the edge of the third region R3. The protruding portion RP may include a vertex RP-P which protrudes the most. The vertex RP-P of the protruding portion RP may overlap the first conductive layers (BL1 and DVL). The vertex RP-P of the protruding portion RP may be disposed on the first conductive layer BL1 and DVL. The protruding portion RP may have an isosceles triangular shape in a plan view, but is not limited thereto, and it may have a semicircle shape as shown in FIG. 3B, or it may have a right-angled triangular shape as shown in FIG. 3C and may have any shape including a protruding.

A relationship between one of edges R2-E1 and R2-E2 of the second region R2 and one of edges edge BL1-E and DVL-E of the first conductive layers BL1 and DVL will now be described in detail.

In FIG. 3A, the edges R2-E1 and R2-E2 of the second region R2 and the edges BL1-E and DVL-E of the first conductive layer (BL1 and DVL) may obliquely traverse.

The edges R2-E1 and R2-E2 of the second region R2 and the edges BL1-E and DVL-E of the first conductive layer (BL1 and DVL) may form an acute angle. A part of the second region R2, forming the acute angle Q1 with respect to the edges of the first conductive layer (BL1 and DVL) may serve as an etch stopper ES. In the process of forming the semiconductor layer, it is possible to prevent excessive erosion of the boundary between the semiconductor layer and the first conductive layer.

The third region R3 is a portion that overlaps the first conductive layer (BL1 and DVL). The third region R3 include two edges R3-E1 and R3-E2 that face each other. A distance between the two edges R3-E1 and R3-E2 may have a uniform width, a third width W3. The third region R3 may have a rectangular shape.

The first width W1 and the third width W3 according to the embodiment may be substantially the same. In the manufacturing process, a first photosensitive film pattern for forming the first region R1 may be designed to have a first photosensitive film width. A third photosensitive film pattern for forming the third region R3 may be designed to have a third photosensitive film width. The first photosensitive film width and the third photosensitive film width may be designed to be different from each other. For example, the third photosensitive film width may be designed to be larger than the first photosensitive film width in a mask. Because light irradiated to the third region that overlaps the first conductive layers BL1 and DVL when forming the photosensitive film pattern may be reflected by the first conductive layers BL1 and DVL, the third photosensitive film pattern may have a width that is smaller than the initially designed third photosensitive film width. Substantially, the first photosensitive film pattern and the third photosensitive film pattern after development may have the same width. That is, in the designing stage in the manufacturing process, the mask pattern for forming the third photosensitive film may be designed to have a larger width than that of the first photosensitive film, but substantially, the first and third photosensitive patterns may be manufactured to have the same width, and accordingly, the manufactured semiconductor layer ACT1 may have the first width W1 and the third width W3 that are the same.

Next, referring to FIG. 4A, a semiconductor layer ACT1 according to an embodiment includes a first region R1 that is disposed between the first conductive layers BL1 and DVL not to overlap the first conductive layers BL1 and DVL, a third region R3 overlapping the first conductive layer (BL1 and DVL), and a second region R2 that is disposed between the first region R1 and the third region R3. The second region R2 may overlap edges BL1-E and DVL-E of the first conductive layer (BL1 and DVL).

The first region R1 may include two edges R1-E1 and R1-E2 that face each other. In the first region R1, a distance between the edges R1-E1 and R1-E2 has a uniform first width W1. The first region R1 may have a quadrangular shape.

The second region R2 may include edges R2-E1 and R2-E2 connected to the edges R1-E1 and R1-E2 of the first region R1. The edges R2-E1 and R2-E2 of the second region R2 may be inclined with respect to the edges BL1-E and DVL-E of the first conductive layer (BL1 and DVL).

The second region R2 may overlap the edges BL1-E and DVL-E of the first conductive layer (BL1 and DVL). A width of the second region that overlaps the edges BL1-E and DVL-E of the first conductive layer (BL1 and DVL) may have a second width W2. The second width W2 may be larger than the first width W1. The second region R2 may have a width that is gradually widened toward the third region R3 from the first region R1.

The third region R3 is a portion that overlaps the first conductive layer (BL1 and DVL). The third region R3 includes two edges R3-E1 and R3-E2 that face each other. A distance between the two edges R3-E1 and R3-E2 has a uniform third width W3. The third region R3 may have a quadrangular shape. The third width W3 may be larger than the first width W1. When the width of the third region R3 that overlaps the first conductive layer can be designed freely, the third width W3 may be formed to be larger than the first width W1.

The edges R2-E1 and R2-E2 of the second region R2 according to the embodiment may connect the edges R1-E1 and R1-E2 of the first region R1 and the edges R3-E1 and R3-E2 of the third region R3. The edges R2-E1 and R2-E2 of the second region R2 may be formed in the shape of a straight line as shown in FIG. 4A, but this is not restrictive. The edges R2-E1 and R2-E2 of the second region R2 may be formed in the shape of a curved line as shown in FIG. 4B.

Figure 5:
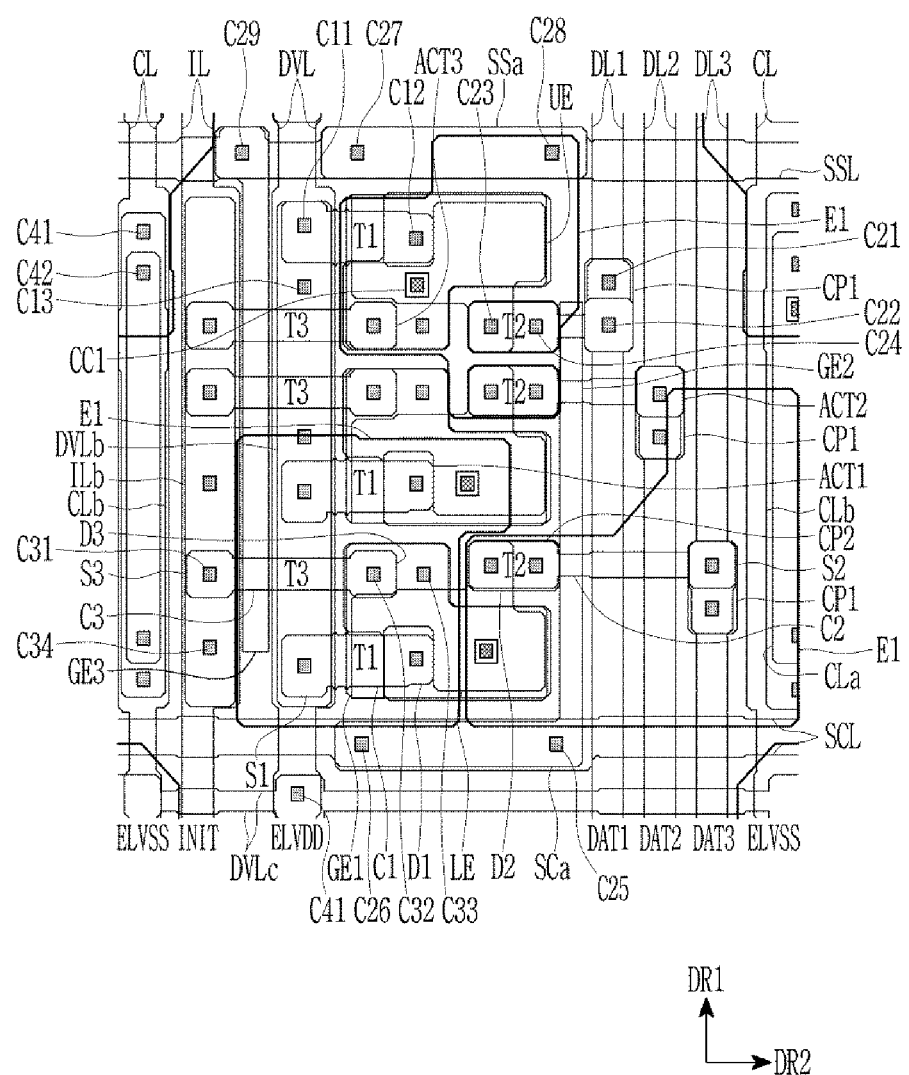
FIG. 5 is a layout view of a pixel according to an embodiment.
Figure 6:
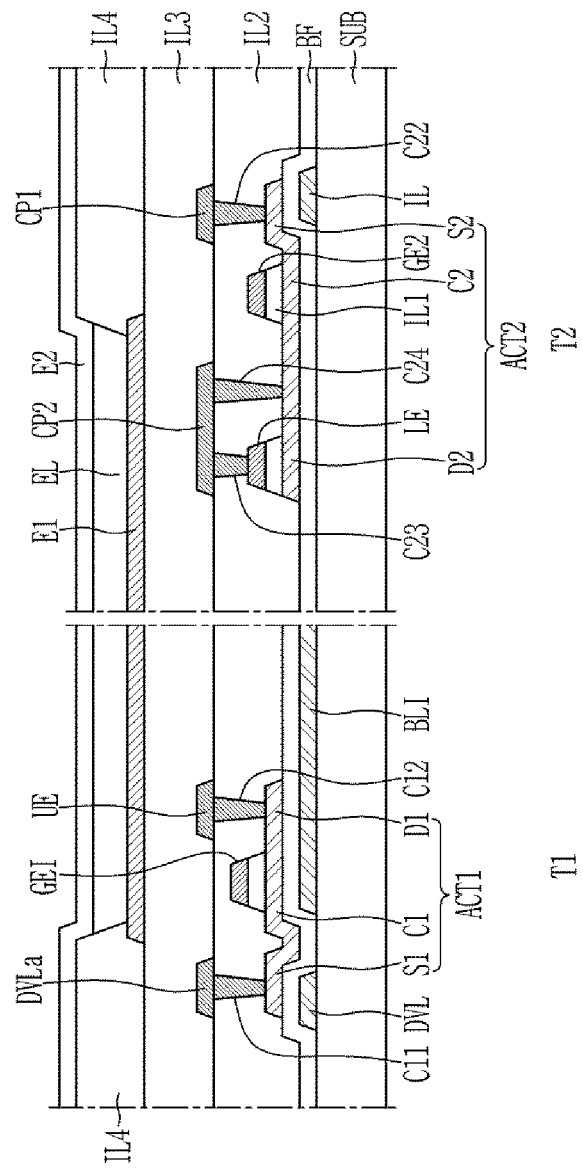
FIG. 6 is a cross-sectional view of some region of the embodiment.

Hereinafter, a detailed structure of a display device according to an embodiment will be described with reference to FIG. 5 to FIG. 10, together with FIG. 1. FIG. 5 is a layout view of a pixel according to an embodiment, FIG. 6 is a cross-sectional view of some region of the embodiment, and FIG. 7, FIG. 8, FIG. 9, and FIG. 10 are layout views respectively illustrating some constituent elements. The above-described transistor is a driving transistor described below and can also be applied to a switching transistor and an initialization transistor. Combinations of the above-described embodiments may also be possible. Here, each of the plurality of pixels PX1, PX2, and PX3 may include the plurality of transistors T1, T2, and T3, the capacitor Cst, and the light emitting element.

Referring to FIG. 5 and FIG. 6, a display device according to an embodiment may include a substrate SUB. The substrate SUB may include an insulating material such as glass, plastic, and the like, and may have flexibility.

Figure 7:
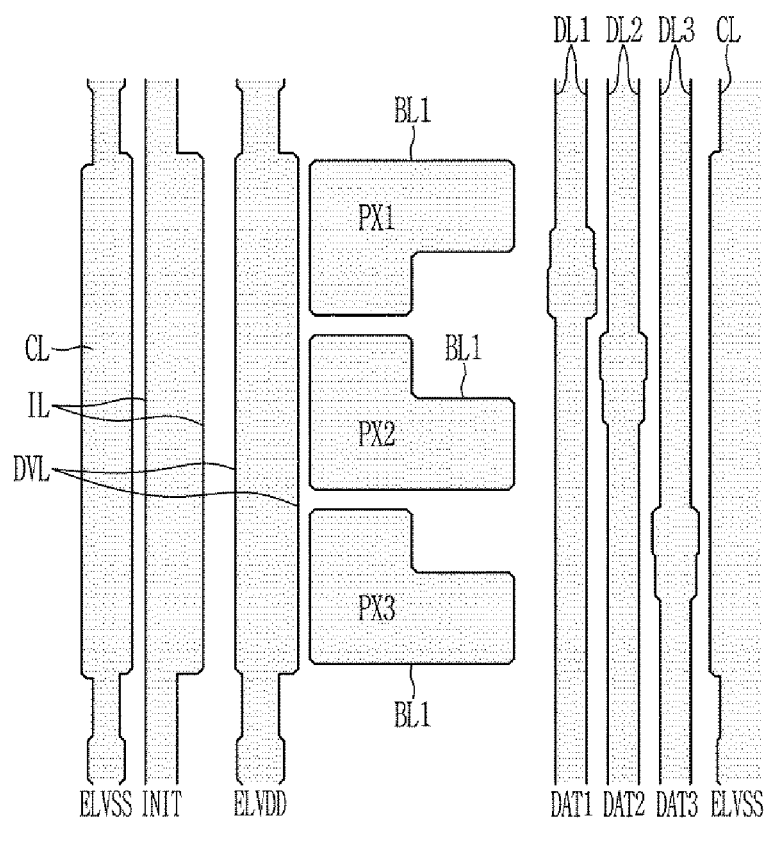
FIG. 7, FIG. 8, FIG. 9 and FIG. 10 are layout views respectively illustrating some constituent elements.

A first conductive layer that includes first data lines DL1, second data lines DL2, and third data lines DL3 may be disposed on the substrate SUB. FIG. 7 illustrates the first conductive layer.

The first data line DL1, the second data line DL2, and the third data line DL3 extend in a first direction DR1. The first data line DL1, the second data line DL2, and the third data line DL3 may each have a predetermined width and may extend in the first direction DR1. The first data line DL1, the second data line DL2, and the third data line DL3 may be disposed to be adjacent to each other along a second direction DR2 that crosses the first direction DR1. The first data line DL1, the second data line DL2, and the third data line DL3 may be disposed to be spaced apart at predetermined intervals. The first data line DL1, the second data line DL2, and the third data line DL3 are applied with different data voltages DAT1, DAT2, and DAT3 and are spaced apart so that a short circuit between them does not occur. The first direction DR1 may be a column direction and the second direction DR2 may be a row direction. The first direction DR1 and the second direction DR2 may be perpendicular to each other. The second data line DL2 may be disposed adjacent to the right side of the first data line DL1, and the third data line DL3 may be disposed adjacent to the right side of the second data line DL2. In this case, the expression that the data lines DL1, DL2, and DL3 are disposed adjacent to each other implies that other wires extending in a direction that is parallel with the data lines DL1, DL2, and DL3 are not disposed between the data lines DL1, DL2, and DL3. That is, no other wires extending in the direction parallel with the first data line DL1 and the second data line DL2 that are adjacent to each other is disposed between the first data line DL1 and the second data line DL2. In addition, no other wire is disposed between the second data line DL2 and the third data line DL3 which are adjacent to each other.

The first conductive layer may further include a common voltage line CL, an initialization voltage line IL, a driving voltage line DVL, and a first metal layer BL1.

The common voltage line CL, the initialization voltage line IL, and the driving voltage line DVL extend in the first direction DR1. The common voltage line CL, the initialization voltage line IL, and the driving voltage line DVL may extend in a direction that is parallel with the first to third data lines DL1, DL2, and DL3. The common voltage line CL, the initialization voltage line IL, and the driving voltage line DVL may be disposed to be adjacent to each other along the second direction DR2. The common voltage line CL, the initialization voltage line IL, and the driving voltage line DVL may be disposed to be spaced apart from each other at predetermined intervals. The common voltage line CL is applied with a common voltage ELVSS, the initialization voltage line IL is applied with the initialization voltage INIT, and the driving voltage line DVL may be applied with the driving voltage ELVDD. The common voltage line CL, the initialization voltage line IL, and the driving voltage line DVL to which different voltages are applied can be spaced apart so that a short circuit does not occur. The initialization voltage line IL may be disposed between the common voltage line CL and the driving voltage DVL. However, their positions are not limited thereto and may be changed.

The first metal layer BL1 may be disposed between the driving voltage line DVL and the first data line DL1 in a plan view. Each of the first to third pixels PX1, PX2, and PX3 includes a first metal layer BL1, and a plurality of first metal layers BL1 may be disposed to be adjacent to each other along the first direction DR1. In a plan view, the first metal layer BL1 of the second pixel PX2 may be disposed below the first metal layer BL1 of the first pixel PX1, and the first metal layer BL1 of the third pixel PX3 may be disposed below the first metal layer BL1 of the second pixel PX2.

A planar shape of the first metal layer BL1 may be a polygon. The first metal layers BL1 of the plurality of pixels PX1, PX2, and PX3 may have the same planar shape, or may have different planar shapes. For example, a planar shape of the first metal layer BL1 of the first pixel PX1 and a planar shape of the first metal layer BL1 of the second pixel PX2 may be line symmetrical to each other, and planar shapes of the first metal layers BL1 of the second pixel PX2 and the third pixel PX3 may be the same.

The first conductive layer may include molybdenum (Mo), aluminum (Al), copper (Cu), silver (Ag), chromium (Cr), tantalum (Ta), titanium (Ti), and the like, and may include a single-layered or multi-layered structure including them. For example, the first conductive layer may include a double-layered structure which includes a layer including titanium and a layer including copper.

A buffer layer BF, which is an insulating layer, may be disposed on the first conductive layer that includes the first data line DL1, the second data line DL2, the third data line DL3, the common voltage line CL, the initialization voltage line IL, the driving voltage DVL, and the first metal layer BL1.

Figure 8:
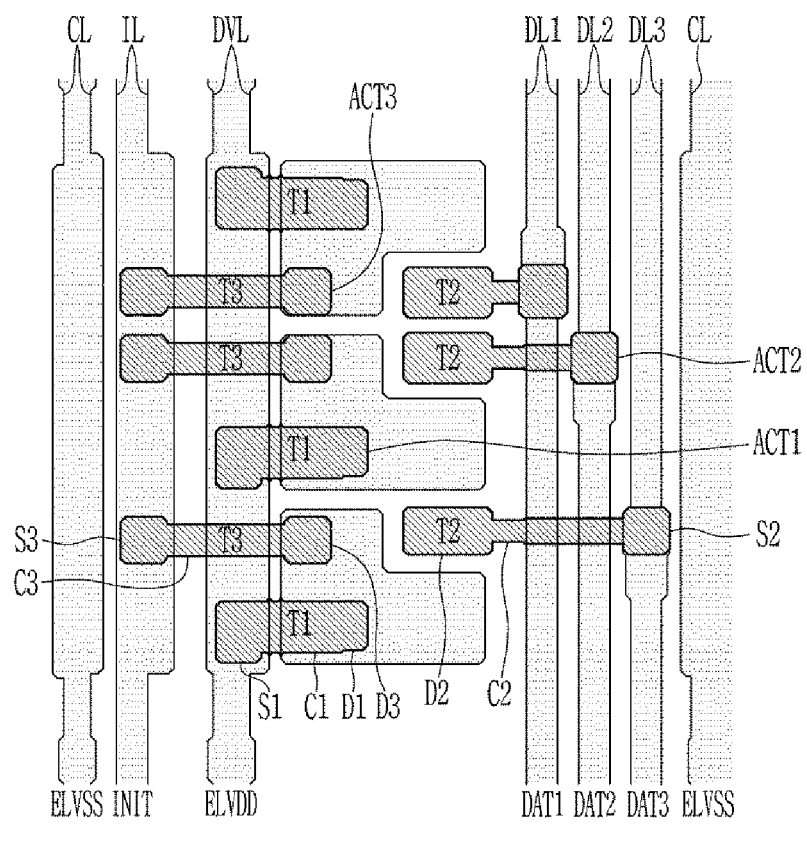

On the buffer layer BF, a first semiconductor layer ACT1 including a channel C1, a first electrode region S1, and a second electrode region D2 of a driving transistor T1 of each of the first to third pixels PX1, PX2, and PX3, a second semiconductor layer ACT2 including a channel C2, a first electrode region S2, and a second electrode region D2 of a second transistor T2, and a third semiconductor layer ACTS including a channel C3, a first electrode region S3, and a second electrode region D3 of a third transistor T3 may be disposed. FIG. 8 illustrates the first conductive layer and the semiconductor layer. The semiconductor layer may include a semiconductor material such as amorphous silicon, polysilicon, or an oxide semiconductor.

The channel C1, the first electrode region S1, and the second electrode region D1 of the driving transistor T1 may be formed in the shape of rods extending in the second direction DR2. The channel C1 of the driving transistor T1 may be disposed between the first electrode region S1 and the second electrode region D1. The first electrode region S1 of the driving transistor T1 may be connected to the driving voltage line DVL and may receive a driving voltage ELVDD from the driving voltage line DVL. However, the first electrode region S1 of the driving transistor T1 may not be directly connected to the driving voltage line DVL. The first semiconductor layer ACT1 of the driving transistor T1 may overlap the first conductive layer. In particular, the first electrode region S1 may overlap the driving voltage line DVL and the channel C1 and the second electrode region D1 may overlap the first metal layer BL1.

The driving transistors T1 of the first to third pixels PX1, PX2, and PX3 may be sequentially disposed along the first direction DR1. That is, in a plan view, the driving transistor T1 of the second pixel PX2 may be disposed below the driving transistor T1 of the first pixel PX1, and the driving transistor T1 of the third pixel PX3 may be disposed below the driving transistor T1 of the second pixel PX2.

The channel C2, the source region S2, and the second electrode region D2 of the switching transistor T2 may be formed in the shape of rods extending in the second direction DR2. The channel C2 of the switching transistor T2 may be disposed between the first electrode region S2 and the second electrode region D2. The first electrode region S2 of the switching transistor T2 may overlap a respective data line among the data lines DL1, DL2, and DL3, and may be connected to the respective data line among the data lines DL1, DL2, and DL3. The first electrode region S2 of the switching transistor T2 of the first pixel PX1 may be connected to the first data line DL1. The first electrode region S2 of the switching transistor T2 of the second pixel PX2 may be connected to the second data line DL2. The first electrode region S2 of the switching transistor T2 of the third pixel PX3 may be connected to the third data line DL3. The first electrode region S2 of the switching transistor T2 of each of the first to third pixels PX1, PX2, and PX3 may not be directly connected to the respective data lines DL1, DL2, and DL3.

The switching transistors T2 of the first to third pixels PX1, PX2, and PX3 may be sequentially disposed along the first direction DR1. That is, in a plan view, the switching transistor T2 of the second pixel PX2 may be disposed below the switching transistor T2 of the first pixel PX1, and the switching transistor T2 of the third pixel PX3 may be disposed below the switching transistor T2 of the second pixel PX2. The switching transistors T2 of the first to third pixels PX1, PX2, and PX3 are respectively connected to different data lines DL1, DL2, and DL3.

The channel C3, the first electrode region S3, and the second electrode region D3 of the initialization transistor T3 may be formed in the shape of rods extending in the second direction DR2. The channel C3 of the initialization transistor T3 may be disposed between the first electrode region S3 and the second electrode region D3. The second electrode region D3 of the initialization transistor T3 may overlap the initialization voltage line IL. The second electrode region D3 of the initialization transistor T3 may be connected to the initialization voltage line IL, and may receive the initialization voltage INIT. However, the second electrode region D3 of the initialization transistor T3 may not be directly connected to the initialization voltage line IL.

The initialization transistor T3 of each of the first to third pixels PX1, PX2, and PX3 may be sequentially disposed along the first direction DR1. That is, in a plan view, the initialization transistor T3 of the second pixel PX2 may be disposed below the initialization transistor T3 of the first pixel PX1, and the initialization transistor T3 of the third pixel PX3 may be disposed below the initialization transistor T3 of the second pixel PX2.

A first insulation layer IL1 may be disposed on the semiconductor layers ACT1, ACT2, and ACT3 that include the channel C1, the first electrode region S1, and the second electrode region D1 of the driving transistor T1, the channel C2, the first electrode region S2, and the second electrode region D2 of the switching transistor T2, and the channel C3, the first electrode region S3, and the second electrode region D3 of the initialization transistor T3.

A second conductive layer that includes a gate electrode GE1 of the driving transistor T1, a gate electrode GE2 of the switching transistor T2, and a gate electrode GE3 of the initialization transistor T3 of each of the first to third pixels PX1, PX2, and PX3, and a lower storage electrode LE may be disposed on the first insulation layer IL1

Figure 9:
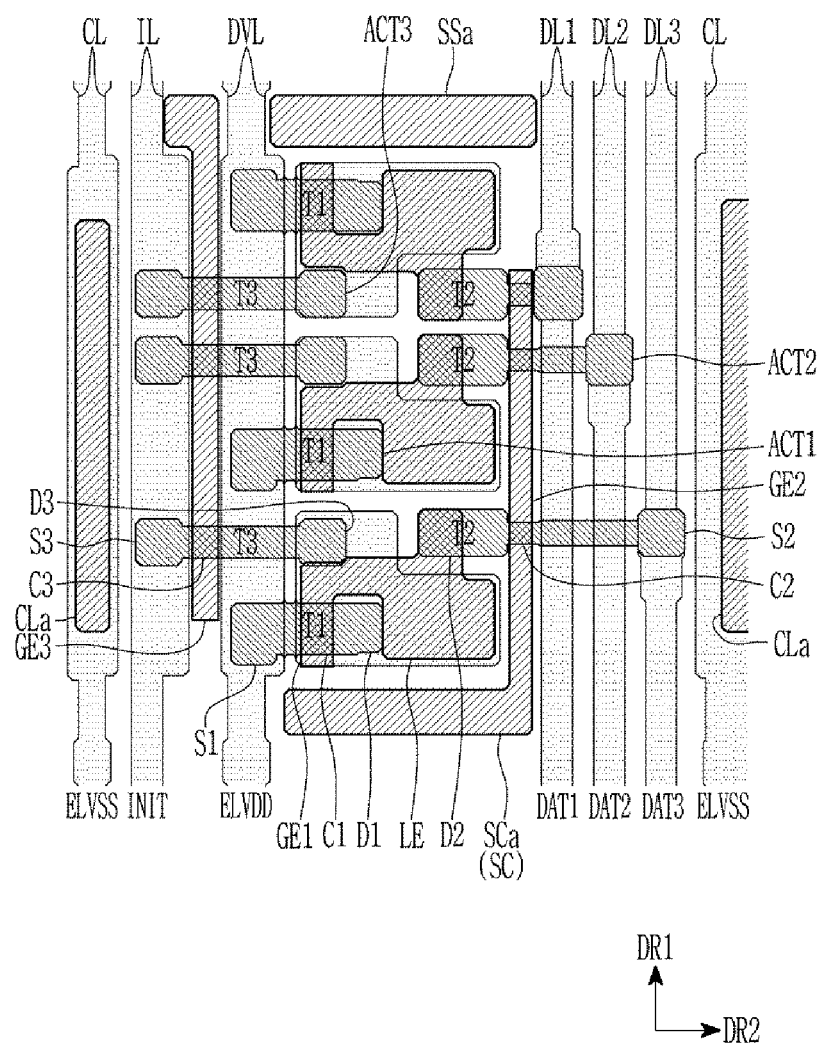

FIG. 9 illustrates the first conductive layer, the semiconductor layer, and the second conductive layer.

The gate electrode GE1 of the driving transistor T1 may overlap the channel C1 of the driving transistor T1. The gate electrode GE1 of the driving transistor T1 may be connected to the lower storage electrode LE or may be integrally formed with the lower storage electrode LE. The lower storage electrode LE may overlap the second electrode region D2 of the switching transistor T2. The lower storage electrode LE may be connected to the second electrode region D2 of the switching transistor T2. However, the lower storage electrode LE may not be directly connected to the second electrode region D2 of the switching transistor T2.

A planar shape of the lower storage electrode LE may be a polygon. The planar shapes of the lower storage electrodes LE of the first to third pixels PX1, PX2, and PX3 may be the same as or different from each other. For example, the planar shapes of the lower storage electrodes LE of the first pixel PX1 and the second pixel PX2 may be line symmetrical to each other, and the planar shapes of the lower storage electrodes LE of the second pixel PX2 and the third pixel PX3 may be the same.

The gate electrode GE2 of the switching transistor T2 may overlap the channel C2 of the switching transistor T2. The gate electrodes GE2 of the switching transistors T2 of the first to third pixels PX1, PX2, and PX3 may be connected to each other, or may be integrally formed with each other. Thus, the gate electrodes GE2 of the switching transistors T2 of the first to third pixels PX1, PX2, and PX3 may be applied with the same first scan signal SC. In this case, the gate electrodes GE2 of the switching transistors T2 that are connected to each other may be formed in the shape of rods that extend in the first direction DR1.

The gate electrode GE3 of the initialization transistor T3 may overlap the channel C3 of the initialization transistor T3. The gate electrode GE3 of the initialization transistors T3 of the first to third pixels PX1, PX2, and PX3 are connected to each other, and may be integrally formed with each other. Thus, the gate electrodes GE3 of the initialization transistors T3 of the first to third pixels PX1, PX2, and PX3 may be applied with the same second scan signal SS. In this case, the gate electrodes GE3 of the initialization transistors T3 which are connected to each other may be formed in the shape of rods extending in the first direction DR1.

After forming the second conductive layer, a doping process may be performed. The semiconductor layer covered by the second conductive layer is hardly doped, and a portion of the semiconductor layer not covered by the second conductive layer is heavily doped with dopants, thereby having the same characteristic as a conductor. That is, the channel C1 of the driving transistor T1, the channel C2 of the switching transistor T2, and the channel C3 of the initialization transistor T3 which are covered by the second conductive layer are not doped. The first electrode region S1 and the second electrode region D1 of the driving transistor T1, the first electrode region S2 and the second electrode region D2 of the switching transistor T2, and the first electrode region S3 and the second electrode region D3 of the initialization transistor T3 which are not covered by the second conductive layer are heavily doped with dopants, thereby having the same characteristic as a conductor.

A second insulation layer IL2 may be disposed on the second conductive layer.

Figure 10:
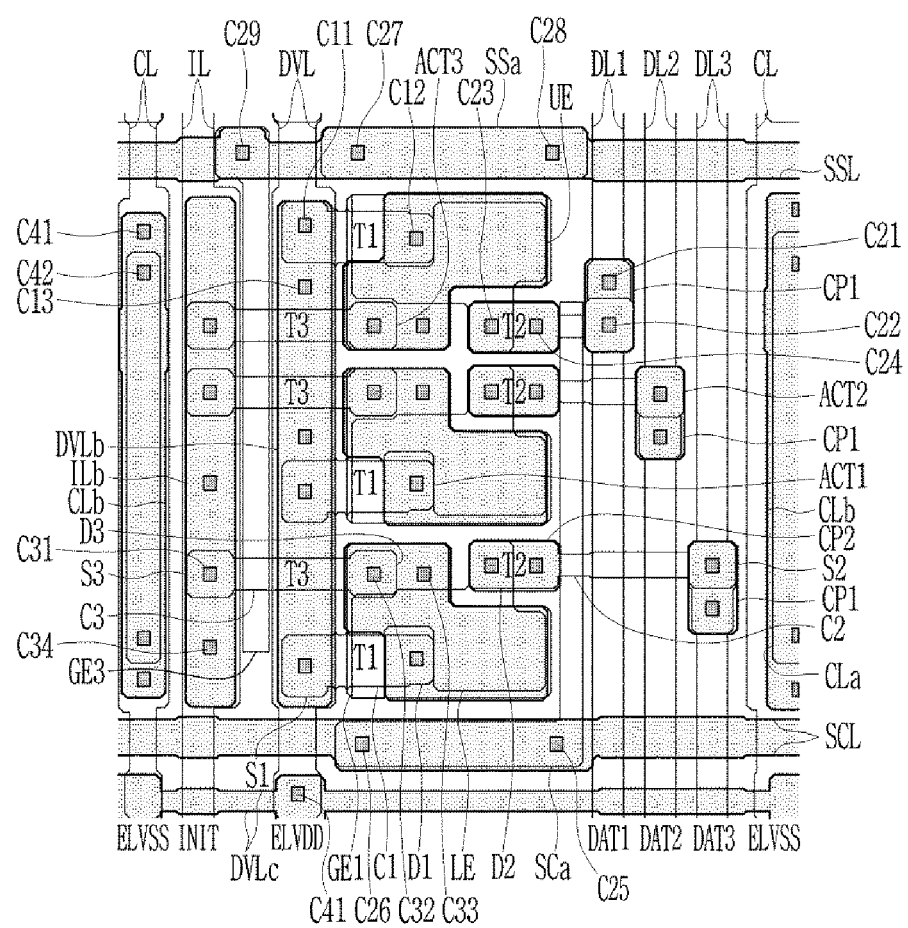

As shown in FIG. 10, a third conductive layer may be disposed on the second insulation layer IL2. The third conductive layer may include a first scan line SCL, a second scan line SSL, an upper storage electrode UE, a first connection pattern CP1, a second connection pattern CP2, a third connection pattern CLb, a fourth connection pattern ILb, a fifth connection pattern DVLb, and an auxiliary driving voltage line DVLc.

The first scan line SCL extend in the second direction DR2. The first scan line SCL may cross the data lines DL1, DL2, and DL3. The first scan line SCL and the data lines DL1, DL2, and DL3 may overlap at crossing portions. The first scan line SCL may overlap a first auxiliary scan pattern SCa that is disposed on the second conductive layer.

The first scan line SCL may be connected to the first auxiliary scan pattern SCa through contact holes C25 and C26. The first auxiliary scan pattern SCa may serve to reduce resistance of the first scan line SCL. The first auxiliary scan pattern SCa may not overlap the data lines DL1, DL2, and DL3. The first scan line SCL may have a shape that extends from one end of the substrate SUB to the other end of the substrate SUB along the second direction DR2. The first auxiliary scan pattern SCa may have a length that corresponds to a region between the driving voltage line DVL and the first data line DL1. The first scan line SCL may be applied with the first scan signal SC. The first scan line SCL may be connected to the gate electrode GE2 of the switching transistor T2 through the first auxiliary scan pattern SCa. Thus, the gate electrode GE2 of the switching transistor T2 may receive the first scan signal SC from the first scan line SCL.

The second scan line SSL may extend in the second direction DR2. The second scan line SSL may cross the data lines DL1, DL2, and DL3. The second scan line SSL and the data lines DL1, DL2, and DL3 may overlap at the crossing region. The second scan line SSL may overlap the second conductive layer that is disposed on the second auxiliary scan pattern SSa. The second scan line SSL may be connected to the second auxiliary scan pattern SSa through contact holes C27 and C28. The second auxiliary scan pattern SSa may serve to reduce resistance of the second scan line SSL. The second auxiliary scan pattern SSa may overlap the data lines DL1, DL2, and DL3. The second scan line SSL may have a shape that extends from one end to the other end of the substrate SUB along the second direction DR2. The second auxiliary scan pattern SSa may have a length that corresponds to a region between the driving voltage line DVL and the first data line DL1. The second scan line SSL may be applied with the second scan signal SS. The second scan line SSL may be connected to the gate electrode GE3 of the initialization transistor T3 through a contact hole C29. Thus, the gate electrode GE3 of the initialization transistor T3 may receive the second scan signal SS from the second scan line SSL.

The upper storage electrode UE may overlap the lower storage electrode LE in a plan view. The lower storage electrode LE, the upper storage electrode UE, and the second insulation layer IL2 disposed between the lower storage electrode LE and the upper storage electrode UE may form a capacitor Cst. The lower storage electrode LE, the first metal layer BL1 and the first insulation layer IL1 disposed between the first metal layer and the lower storage electrode may also form a capacitor Cst.

The upper storage electrode UE may overlap the second electrode region D1 of the driving transistor T1. The second insulation layer IL2 may include a contact hole C12 that overlaps the upper storage electrode UE and the second electrode region D1 of the driving transistor T1. The upper storage electrode UE may be connected to the second electrode region D1 of the driving transistor T1 through the contact hole C12.

The upper storage electrode UE may overlap the first electrode region S3 of the initialization transistor T3. The upper storage electrode UE and the first electrode region S3 of the initialization transistor T3 may be electrically connected through a contact hole C32 that overlaps the upper storage electrode UE and the first electrode region S3 of the initialization transistor T3.

Each of the first to third pixel PX1, PX2, and PX3 includes an upper storage electrode UE, a lower storage electrode LE, and a first metal layer BL1. The upper storage electrode UE, the lower storage electrode LE, and the first metal layer BL1 of the first to third pixels PX1, PX2, and PX3 may be disposed between first scan line SCL and the second scan line SSL in a plan view. In addition, the upper storage electrode UE, the lower storage electrode LE, and the first metal layer BL1 of the first to third pixels PX1, PX2, and PX3 may be disposed between the driving voltage line DVL and the first data line DL1 in a plan view. That is, the upper storage electrode UE, the lower storage electrode LE, and the first metal layer BL1 of the first to third pixels PX1, PX2, and PX3 may be surrounded by the first scan line SCL, the second scan line SSL, the driving voltage DVL, and the first data line DL1. The upper storage electrodes UE of the first to third pixels PX1, PX2, and PX3 may be disposed to be adjacent to each other along the first direction DR1. In a plan view, the upper storage electrode UE of the second pixel PX2 may be disposed below the upper storage electrode UE of the first pixel PX1 and the upper storage electrode UE of the third pixel PX2 may be disposed below the upper storage electrode UE of the second pixel PX2. The lower storage electrodes LE of the first to third pixels PX1, PX2, and PX3 may be disposed to be adjacent to each other along the first direction DR1. In a plan view, the lower storage electrode LE of the second pixel PX2 may be disposed below the lower storage electrode LE of the first pixel PX1 and the lower storage electrode LE of the third pixel PX3 may be disposed below the lower storage electrode LE of the second pixel PX2.

The planar shape of the upper storage electrode UE may be a polygon. The upper storage electrodes UE of the first to third pixels PX1, PX2, and PX3 may have the same or different planar shapes. For example, the planar shapes of the upper storage electrodes UE of the first pixel PX1 and the second pixel PX2 may be line symmetrical to each other, and the planar shapes of the upper storage electrodes UE of the second pixel PX2 and the third pixel PX3 may be the same.

Each of the pixels PX1, PX2, and PX3 may include a first connection pattern CP1. The first connection pattern CP1 of each of the pixels PX1, PX2, and PX3 may overlap each of the data lines DL1, DL2, and DL3. The second insulation layer IL2 may include contact holes C21 and C22 that overlap the first connection pattern CP1 and the respective data lines DL1, DL2, and DL3. The first connection pattern CP1 may be connected to the data lines DL1, DL2, and DL3 through the contact hole C21, and may be connected to the first electrode region S2 of the switching transistor T2 through the contact hole C22. The first connection pattern CP1 may connect between the respective data lines DL1, DL2, and DL3 and the first electrode region S2 of the switching transistor T2. In the first pixel PX1, the first connection pattern CP1 may connect the first data line DL1 and the first electrode region S2 of the switching transistor T2. In the second pixel PX2, the first connection pattern CP1 may connect the second data line DL2 and the first electrode region S2 of the switching transistor T2. In the third pixel PX3, the first connection pattern CP1 may connect the third data line DL3 and the first electrode region S2 of the switching transistor T2.

Each of the pixels PX1, PX2, and PX3 may include a second connection pattern CP2. The second connection pattern CP2 of each of the pixels PX1, PX2, and PX3 may overlap the second electrode region D2 of the switching transistor T2. The second connection pattern CP2 may be connected to the second electrode region D2 of the switching transistor T2 through the contact hole C24. The second connection pattern CP2 of each of the pixels PX1, PX2, and PX3 may overlap the lower storage electrode LE. The second connection pattern CP2 may be connected to the lower storage electrode LE through the contact hole C23. Thus, in each of the pixels PX1, PX2, and PX3, the second connection pattern CP2 may connect the second electrode region D2 of the switching transistor T2 and the lower storage electrode LE.

The third connection pattern CLb may overlap the common voltage line CL. The third connection pattern CLb may be formed in the shape of a rod extending in the first direction DR1. The common voltage line CL may have a shape that extends from one end to the other end of the substrate SUB in a plan view. The third connection pattern CLb may be connected to the common voltage line CL and a common voltage auxiliary pattern CLa through contact holes C41 and C42, and may serve to reduce resistance of the common voltage line CL.

The fourth connection pattern ILb may overlap the initialization voltage line IL. The fourth connection pattern ILb may be connected to the initialization voltage line IL through the contact hole C34. The fourth connection pattern ILb may serve to reduce resistance of the initialization voltage line IL. The fourth connection pattern ILb may be formed in the shape of a rod extending in the first direction DR1. The fourth connection pattern ILb may overlap the first electrode region S3 of the third transistor T3. The fourth connection pattern ILb may be connected to the first electrode region S3 of the third transistor T3 through the contact hole C31. The fourth connection pattern ILb may electrically connect the initialization voltage line IL and the first electrode region S3 of the third transistor T3. The first electrode region S3 of the third transistor T3 may receive the initialization voltage INIT.

The fifth connection pattern DVLb may overlap the driving voltage line DVL. The fifth connection pattern DVLb may be connected to the driving voltage line DVL through the contact hole C13. The fifth connection pattern DVLb may serve to reduce resistance of the driving voltage line DVL. The fifth connection pattern DVLb may be formed in the shape of a rod extending in the first direction DR1. The fifth connection pattern DVLb may have a shape that is disconnected for each of three pixels PX1, PX2, and PX3. In addition, the fifth connection pattern DVLb may be electrically connected to the first electrode region S1 of the driving transistor T1 through the contact hole C11. The fifth connection pattern DVLb may connect the driving voltage line DVL and the first electrode region S1 of the driving transistor T1.

The auxiliary driving voltage line DVLc may extend in the second direction DR2. The auxiliary driving voltage line DVLc may cross the driving voltage line DVL. The auxiliary driving voltage line DVLc and the driving voltage line DVL may overlap each other in the crossing portion. The auxiliary driving voltage line DVLc may be connected to the driving voltage line DVL through the contact hole C41. The auxiliary driving voltage line DVLc may be applied with the driving voltage ELVDD. The auxiliary driving voltage line DVLc may serve to reduce resistance of the driving voltage line DVL.

A third insulation layer IL3 may be disposed on the third conductive layer.

At least one of the first conductive layer, the second conductive layer, and the third conductive layer may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and an alloy thereof. Each of the first conductive layer, the second conductive layer, and the third conductive layer may be formed of a single layer or multiple layers. For example, each of the first conductive layer, the second conductive layer, and the third conductive layer may have a multilayer structure including a lower layer including titanium, and an upper layer including copper.

At least one of the buffer layer BF, the first insulation layer IL1, the second insulation layer IL2, and the third insulation layer IL3 may include an inorganic insulating material such as a silicon nitride (SiNx), a silicon oxide (SiOx), a silicon oxynitride (SiON), and the like, and/or an organic insulating material such as polyimide, an acryl-based polymer, a siloxane-based polymer, and the like.

As shown in FIG. 5, a fourth conductive layer that includes a first electrode E1 may be disposed on the third insulation layer IL3.

The first electrode E1 of each of the pixels PX1, PX2, and PX3 may overlap the upper storage electrode UE. The third insulation layer IL3 may include a contact hole CC1 that overlaps the first electrode E1 and the upper storage electrode UE. The first electrode E1 may be connected to the upper storage electrode UE through the contact hole CC1.

The first electrode E1 of the first pixel PX may overlap some of the transistors T1, T2, and T3 of the first pixel PX. The first electrode E1 may overlap some of transistors T1, T2, and T3 of a pixel other than the first pixel PX1. For example, the first electrode E1 may overlap the switching transistor T2 of the second pixel PX2. The first electrode E1 of the second pixel PX may overlap some of transistors T1, T2, and T3 of the second pixel PX2. The first electrode E1 may overlap some of transistors T1, T2, and T3 of a pixel other than the second pixel PX2. For example, the first electrode E1 of the second pixel PX may overlap the driving transistor T1 and the initialization transistor T3 of the third pixel PX3. The first electrode E1 of the third pixel PX3 may overlap some of transistors T1, T2, and T3 of the third pixel PX3. The first electrode E1 may overlap some of transistors T1, T2, and T3 of a pixel other than the third pixel PX3. The first electrode E1 may overlap at least some of the first to third data lines DL1, DL2, and DL3. For example, the first electrode E1 of the third pixel PX may overlap the first to third data lines DL1, DL2, and DL3.

In the present embodiment, transistors T1, T2, and T3 of each of the pixels PX1, PX2, and PX3 may or may not overlap the first electrode E1. That is, each of the first electrodes E1 may overlap a different pixel.

A fourth insulation layer IL4 may be disposed on the fourth conductive layer. The fourth insulation layer IL4 may include an organic insulating material such as a polyacryl-based resin, a polyimide-based resin, and the like. The fourth insulation layer IL4 may include an opening that exposes each of the first electrodes E1.

An emission layer EL may be disposed on the fourth insulation layer IL4 and the first electrode E1. The emission layer EL may be disposed in an opening of the fourth insulation layer IL4. The emission layer EL may include an organic light emitting material or an inorganic light emitting material. The emission layer EL is partially formed on the substrate SUB, but this is not restrictive. The emission layer EL may be disposed to overlap the entire surface of the substrate SUB.

A second electrode E2 may be disposed on the emission layer EL. The second electrode E2 may be formed on the entire substrate SUB. That is, one second electrode E2 may be formed throughout the plurality of pixels PX1, PX2, and PX3. The second electrode E2 may be electrically connected to the common voltage line CL through a contact hole (not shown). The second electrode E2 may be applied with the common voltage ELVSS.

At least one of the fourth conductive layer and the second electrode E2 may be formed of a transparent metal oxide such as indium tin oxide (ITO), indium zinc oxide (IZO), and the like.

The first electrode E1, the emission layer EL, and the second electrode E2 of each of the pixels PX1, PX2, and PX3 may form a light emitting diode ED. In this case, the first electrode E1 may be an anode, and the second electrode E2 may be a cathode.

Meanwhile, in the layout view of FIG. 5, the embodiment of FIG. 3A is applied to the driving transistor T1, but this is not restrictive, and the embodiments of FIG. 3B to FIG. 4 are also applicable. It can also be applied to the switching transistor and the initialization transistor in addition to the driving transistor. In addition, a combination of the embodiments of FIG. 3A to FIG. 4B is also applicable.

While this inventive concept has been described in connection with what is presently considered to be practical embodiments, it is to be understood that the inventive concept is not limited to the disclosed embodiments. On the contrary, it is intended to cover various modifications and equivalent arrangements included within the spirit and scope of the appended claims.

What is claimed is:

1. A display device comprising:
a first conductive layer that is disposed on a substrate;
a transistor that is disposed on the substrate; and
a light emitting element that is electrically connected to the transistor,
wherein the transistor comprises a semiconductor layer that at least partially overlaps the first conductive layer and is disposed on the first conductive layer, and a gate electrode that is disposed on the semiconductor layer,
wherein the semiconductor layer comprises a first region that does not overlap the first conductive layer, a third region that overlaps the first conductive layer, and a second region that is disposed between the first region and the third region and traverses an edge of the first conductive layer,
wherein a first width of the semiconductor layer in the first region is smaller than a second width of the semiconductor layer in the second region, and
wherein an edge of the second region traverses the edge of the first conductive layer obliquely.

2. The display device of claim 1, wherein the second region has a protrusion protruding from edges of the first region.

3. The display device of claim 2, wherein the protrusion has a shape of an isosceles triangle, a semi-circle, or a right-angled triangle.

4. The display device of claim 2, wherein the second region comprises a vertex having a broadest width and the vertex overlaps the first conductive layer.

5. The display device of claim 1, wherein the third region of the semiconductor layer has a third width and each of the first width and the third width is uniform.

6. The display device of claim 5, wherein the first width and the third width are substantially equivalent to each other.

7. The display device of claim 5, wherein the first width is smaller than the third width.

8. The display device of claim 1,
wherein the edge of the second region which traverses the edge of the first conductive layer obliquely is formed in the shape of a straight line.

9. The display device of claim 1,
wherein an edge of the second region which traverses the edge of the first conductive layer obliquely is formed in the shape of a curved line.

10. A display device comprising:
a first conductive layer that is disposed on a substrate;
a transistor that is disposed on the substrate; and
a light emitting element that is electrically connected to the transistor,
wherein the transistor comprises:
a semiconductor layer that is partially overlapped with the first conductive layer and is disposed on the first conductive layer, and
a gate electrode that overlaps a channel of the semiconductor layer and is disposed on the semiconductor layer,
wherein the semiconductor layer comprises:
a first region that does not overlap the first conductive layer,
a third region that overlaps the first conductive layer, and
a second region that is disposed between the first region and the third region and includes an edge traversing an edge of the first conductive layer,
wherein the second region has a protrusion protruding from an edge of the first region, and
wherein the edge of the second region traverses the edge of the first conductive layer obliquely.

11. The display device of claim 10, wherein a first width of the semiconductor layer in the first region is smaller than a second width of the semiconductor layer in the second region.

12. The display device of claim 10,
wherein the second region includes a vertex which has a broadest width and overlaps the first conductive layer.

13. The display device of claim 12, wherein a width of the second region is gradually widened toward the vertex.

14. The display device of claim 13, wherein the second region is gradually narrowed toward the third region from the vertex.

15. The display device of claim 14, wherein the second region has a polygonal shape or a semi-circular shape.

16. A display device comprising:
- a first conductive layer that is disposed on a substrate;
- a transistor that is disposed on the substrate; and
- a light emitting element that is electrically connected to the transistor, wherein the transistor comprises:
- a semiconductor layer that at least partially overlaps the first conductive layer and is disposed on the first conductive layer, and
- a gate electrode that is disposed on the semiconductor layer while overlapping a channel of the semiconductor layer, wherein the semiconductor layer comprises:
- a first region that does not overlap the first conductive layer,
- a third region that overlaps the first conductive layer, and
- a second region that that is disposed between the first region and the third region and overlaps an edge of the first conductive layer, wherein a width of the first region is smaller than a width of the third region, and wherein the edge of the second region traverses the edge of the first conductive layer obliquely.

17. The display device of claim 16, wherein the second region includes an edge that connects a first edge of the first region and a second edge of the third region.

18. The display device of claim 17, wherein the edge that connects the first edge of the first region and the second edge of the third region has a shape of a curved line or a straight line.

19. The display device of claim 17, wherein a width of the second region is gradually widened toward the third region.

20. The display device of claim 16, wherein a width of the second region is larger than a width of the first region.

* * * * *